United States Patent [19]
Kenney et al.

[11] Patent Number: 4,642,491
[45] Date of Patent: Feb. 10, 1987

[54] SINGLE TRANSISTOR DRIVER CIRCUIT

[75] Inventors: Donald M. Kenney, Shelburne; Jack A. Mandelman, Underhill, both of Vt.

[73] Assignee: International Business Machines Corporation, Armonk, N.Y.

[21] Appl. No.: 507,375

[22] Filed: Jun. 24, 1983

[51] Int. Cl.$^4$ ............... H03K 17/687; H03K 17/56; N01L 29/80
[52] U.S. Cl. .................................. 307/571; 307/246; 357/22
[58] Field of Search ............... 307/571, 540, 549, 246; 357/22, 522

[56] References Cited
U.S. PATENT DOCUMENTS

| Re. 27,305 | 3/1972 | Polkinghorn et al. | 307/251 |
| 3,387,286 | 6/1968 | Dennard | 340/173 |
| 3,564,290 | 2/1971 | Sonoda | 307/251 |
| 4,024,561 | 5/1977 | Ghatalia | 357/23 |
| 4,199,695 | 4/1980 | Cook et al. | 307/269 |

OTHER PUBLICATIONS

Solid State Electronics, vol. 24, pp. 523-531, 1981 "A Model for the Breakdown Characteristics of p-Channel MOS . . . " by Maes et al.
IBM Journal of Research Development, vol. 24, No. 3, May 1980 "A 65K FET Dynamic Random Access Memory . . . " pp. 318-320 by T. C. Lo et al.

Primary Examiner—Stanley D. Millen
Assistant Examiner—B. P. Davis
Attorney, Agent, or Firm—Stephen J. Limanek

[57] ABSTRACT

A driver circuit is provided which includes a field effect transistor having first and second spaced apart semiconductor regions of a given conductivity type and a third semiconductor region of a conductivity type opposite to the given conductivity type interposed between the first and second regions and having a given sustaining voltage serially connected with a capacitor. The circuit further includes means for applying between the first and second spaced apart regions a given supply voltage having a magnitude greater than the magnitude of the sustaining voltage and less than the breakdown voltage of a PN junction formed in the transistor and means including a control voltage applied to the gate electrode of the transistor for initiating current flow between the first and second spaced apart regions when the given supply voltage is applied between the first and second spaced apart regions.

14 Claims, 6 Drawing Figures

SINGLE TRANSISTOR DRIVER CIRCUIT

TECHNICAL FIELD

This invention relates to a driver circuit and more particularly to a single field effect transistor driver circuit for rapidly charging a capacitive load to a high voltage.

BACKGROUND ART

Driver circuits for charging a capacitor to a high voltage, e.g., to a voltage substantially equal to the magnitude $V_H$ of the power supply voltage of the circuit, are well known. One of the most common driver circuits of this type uses a bootstrap capacitor connected between the source and gate electrodes of a field effect transistor and is described in some detail in, e.g., U.S. Pat. No. Re. 27,305, original filed Dec. 14, 1966, and commonly assigned U.S. Pat. No. 3,564,290 filed on Mar. 13, 1969, by G. Sonoda. Known field effect transistor circuits which use only a single field effect transistor serially connected to a capacitor, such as disclosed in commonly assigned U.S. Pat. No. 3,387,286, filed on July 14, 1967, by R. H. Dennard, normally charge the capacitor only at an exponential rate. It is also known as stated in IBM Journal of Research and Development, Vol. 24, No. 3, May 1980, pp. 318–319, in an article entitled, "A 64K FET Dynamic Random Access Memory: Design Considerations and Description", by T. C. Lo, R. E. Scheuerlein and R. Tamlyn, that a field effect transistor has an impact-ionization-induced device-sustaining voltage which is the drain-to-source voltage of the field effect transistor above which the drain current increases regeneratively until thermal self-destruction of the transistor occurs. To avoid hot electron operation in a field effect transistor, there is taught in commonly assigned U.S. Pat. No. 4,199,695, filed on Mar. 3, 1978, by P. W. Cook and S. E. Schuster, voltage control means adapted to reduce field effect transistor drain to source voltage by connecting a plurality of field effect transistors in series to reduce the drain to source voltage across each device. There is also taught in Solid-State Electronics, Vol. 24, pp. 523–531, 1981, in an article entitled, "A Model for the Breakdown Characteristics of p-Channel MOS Transistor Protection Devices", the use of large current flow through transistors as protective devices. Field effect transistors having various kinds of geometries for controlling current flow are also known, such as a transistor having source and drain regions of a given width with a gate electrode having a width substantially smaller than the given width, as taught in commonly assigned U.S. Pat. No. 4,024,561, filed on Apr. 1, 1976 by A. K. Ghatalia.

DISCLOSURE OF THE INVENTION

It is an object of this invention to provide a high performance driver circuit requiring only a very small space yet which produces high current drive compared with known current driver circuits.

In accordance with the teachings of this invention, a driver circuit is provided which includes a field effect transistor having first and second spaced apart semiconductor regions of a given conductivity type and a third semiconductor region of a conductivity type opposite to the given conductivity type interposed between the first and second regions and having a given sustaining voltage serially connected with a capacitor. The circuit further includes means for applying between the first and second spaced apart regions a voltage having a magnitude greater than the magnitude of the sustaining voltage and means including a small control voltage applied to the gate electrode of the transistor for initiating current flow between the first and second spaced apart regions.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
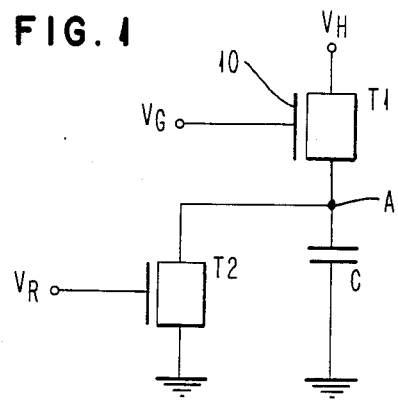
FIG. 1 illustrates an embodiment of a driver circuit of the present invention which utilizes a field effect transistor.
Figure 2:
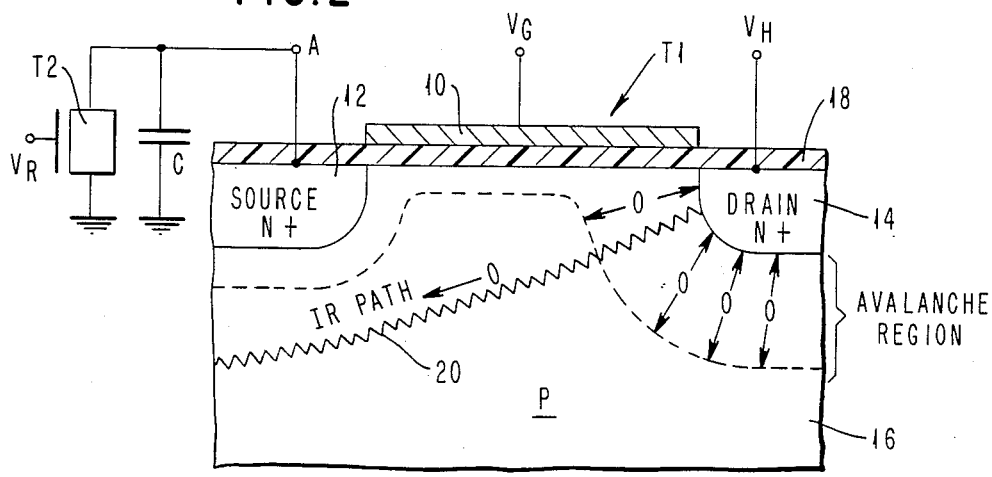
FIG. 2 illustrates the driver circuit of FIG. 1 partly in a cross-sectional view.

Referring to the drawings in more detail, there is illustrated in FIGS. 1 and 2 an embodiment of the driver circuit of the present invention which includes a first field effect transistor T1 having a control gate 10 connected to a control gate electrode $V_G$ and N+ source and drain regions 12 and 14, formed in a P type conductivity semiconductor substrate 16, connected to a node A and a supply voltage terminal $V_H$, respectfully. The transistor T1 may typically have a modest width to length ratio of 20 to 1. A thin insulating layer 18, made, e.g., of silicon dioxide, is disposed between the control gate 10 and the substrate 16. A capacitor C, which may be equal to 1000 picofarads, is serially connected with the transistor T1 between node A and a point of reference potential, such as ground. A switch, which may be a second field effect transistor T2, is provided for selectively discharging the capacitor C by applying an appropriate pulse to terminal $V_R$.

In the operation of the driver circuit illustrated in FIGS. 1 and 2, a relatively high voltage having a magnitude larger than the sustaining voltage of the transistor T1 and less than the intrinsic breakdown voltage of the PN junction formed between drain region 14 and substrate 16 is applied to terminal $V_H$ with zero volts applied to the control gate terminal $V_G$ and with node A at zero volts and transistor T2 off. In this condition, the first transistor T1 is in a high impedance state with negligible or no current flowing between the source and drain regions 12, 14. To charge capacitor C, the voltage at control gate terminal $V_G$ is increased until the voltage at the control gate 10 is equal to or greater than the threshold voltage $V_T$ of the first transistor T1. An inversion layer now forms at the surface of substrate 16 under the control gate 10 and electrons begin to flow along the substrate surface from the source region 12 to the drain region 14. With the voltage at terminal $V_H$ above the sustaining voltage and electrons or current $I_D$ flowing to the drain region 14, electron-hole pairs are generated by the surface electrons $I_D$ in the high field or avalanche region adjacent to the drain region 14 due to the avalanche or impact ionization mechanism. All electrons are attracted to the drain region 14 and contribute to the drain current $I_D$. However, at the same time, the holes drift and diffuse into substrate 16, generally toward the source diffusion, creating an IR or voltage drop within substrate 16, indicated by resistive symbol 20, in a direction which lowers the potential barrier between the source region 12 and the P type semiconductor substrate 16. Consequently, additional electrons surmount the weakened potential barrier and become attracted to the drain region 14. This increase in electrons or current flow $I_D$, in turn, results in more impact or avalanche generated hole current which further reduces the source barrier as a positive feedback mechanism.

With the drain current $I_D$ increasing due to avalanche multiplication, capacitor C becomes more rapidly charged, thus increasing the voltage at node A and, consequently, decreasing the voltage drop between source and drain regions 12, 14. It should be noted that if capacitor C were not serially connected with the first transistor T1, the voltage drop from the drain region 14 to the source region 12 would reach an equilibrium at a very high drain current $I_D$ level depending upon the materials and structural arrangements of the first transistor T1 which defines the sustaining voltage of the first transistor T1.

It can be seen that the voltage applied to the control gate 10 serves as a trigger to initiate the avalanche or positive feedback mechanism, known as snap back, with a seed current $I_D$ flowing at the surface of the substrate 16 into the drain region 14. After the positive feedback mechanism becomes established, the entire cross-section of the source region 12 emits electrons which flow through the bulk of the substrate 16 well below the surface thereof. Accordingly, it should be noted that the control gate 10 loses control of the feedback mechanism and of the flow of the drain current $I_D$. Thus, it should be understood that the sustaining voltage of the transistor T1 is independent of the voltage at the control gate 10.

Figure 3:
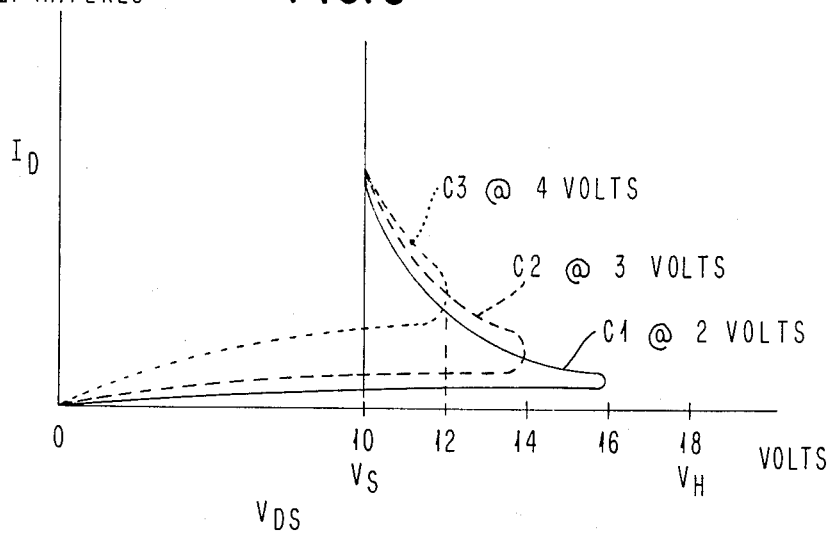
FIG. 3 is a graph showing voltage snap back curves plotted with drain current versus drain-to-source voltages of the field effect transistor at several control voltages.

By referring to FIG. 3 of the drawings, it can be seen that the sustaining voltage $V_S$ is independent of the control gate voltage, although the drain-to-source voltage $V_{DS}$ at which snap back occurs differs depending upon the magnitude of the control gate voltage. It should be noted from curve C1 that with $V_H$ equal to approximately 18 volts, $V_T$ equal to 1.8 volts, the sustaining voltage $V_S$ being equal to 10 volts and with 2 volts applied to the control gate 10, the snap back voltage is 16 volts at which point the drain current $I_D$ rises very rapidly. When the voltage across capacitor C reaches $V_H-V_S$, the first transistor T1 drops out of the sustaining mode, self-limiting the power dissipated in the first transistor T1, thus preventing its destruction. Curve C2 shows that snap back in the first transistor T1 occurs at approximately 14 volts when the control gate 10 is at 3 volts and curve C3 indicates that snap back occurs at approximately 12 volts when the control gate 10 is at 4 volts, while the sustaining voltage remains at 10 volts.

Figure 4:
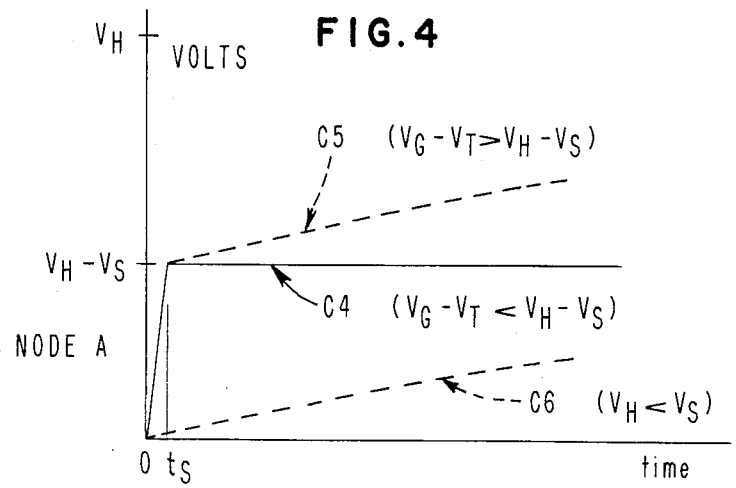
FIG. 4 is a graph indicating the voltage produced across the capacitor of FIG. 1 for different control and drain-to-source voltages.

As indicated in the graph in FIG. 4 of the drawings, when the voltage at the control gate 10 minus the threshold voltage $V_T$ is less than the voltage $V_H$ minus the sustaining voltage $V_S$, the voltage at node A, i.e., across capacitor C, rises rapidly to $V_H-V_S$, or 8 volts, at time $t_S$, which may be within approximately 120 nanoseconds, as indicated by curve C4. The voltage at node A then remains constant for an indefinite period of time. When the voltage at the control gate 10 minus the threshold voltage $V_T$ is greater than the voltage $V_H$ minus $V_S$, the voltage at node A also rises rapidly to $V_H-V_S$ at time $t_S$ but it thereafter continues to rise, as indicated by curve C5, until it reaches the voltage $V_H-V_T$. If the voltage at the supply voltage terminal $V_H$ is less than the sustaining voltage $V_S$, a conventional charging operation occurs, as indicated at C6, wherein the voltage at node A rises to only about 1 volt in approximately 800 nanoseconds and eventually to $V_H-V_T$.

Accordingly, it can be seen that by operating transistor T1 in the sustaining mode, the capacitor C can be charged to a voltage $V_H-V_T$ within a considerably shorter period of time, without destroying transistor T1, than when the capacitor C is charged without the use of the sustaining voltage mode.

To charge the 1000 picofarad capacitor C in an equal amount of time, i.e., in 120 nanoseconds, without entering into the sustaining mode, would typically require the use of a field effect transistor having a width to length ratio of about 500 to 1, instead of the 20 to 1 ratio of transistor T1. The gate capacitance resulting from such a large transistor would require a relatively unrealistically large driver for its gate electrode.

Figure 5:
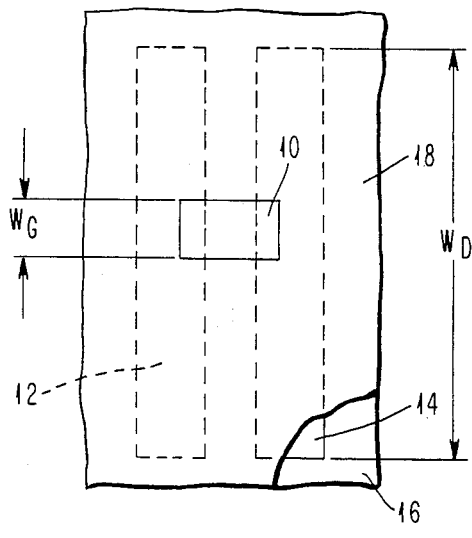
FIG. 5 is a plan view of the field effect transistor shown in cross-sectional view in FIG. 2 of the drawings.

Since the voltage on the control gate 10 is provided only to initiate a flow of electrons from the source to the drain regions 12, 14, only a very small gate electrode is required as indicated in the plan view of FIG. 5 of the drawings. The electrons will initially flow along the surface of the substrate 16 under the control gate 10 and then by avalanche multiplication electrons will flow freely from the entire source region 12, including those portions thereof without the control gate 10, to the drain region 14. This arrangement, therefore, makes a device with a narrow gate having a width $W_G$ appear to be a wide device equal to the width $W_D$ of the drain region 14.

Figure 6:
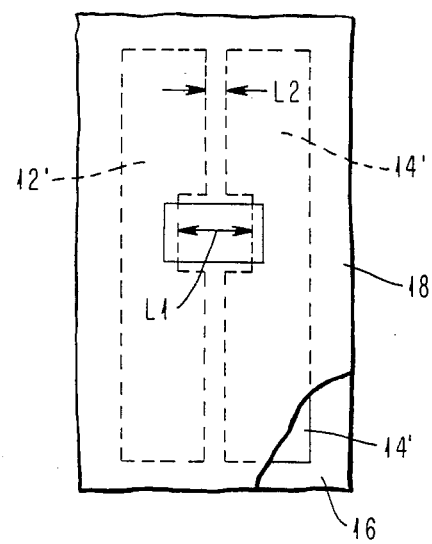
FIG. 6 is a plan view similar to that of FIG. 5 but illustrating a modification thereof.

In the plan view of FIG. 6 of the drawings, a modification of the structure of FIG. 5 is illustrated. By providing a longer channel under the control gate, the onset of the sustaining mode can be altered, and by more closely spacing the source and drain regions throughout the major portion of the width of the source and drain regions, the sustaining voltage can be reduced which permits capacitor C to be charged to a higher voltage than if the entire source diffusion to drain diffusion region spacing were constant at the channel length under the control gate. As can be seen in FIG. 6, spacing L1 between source region 12' and drain region 14' under control gate 10' is considerably longer than the spacing L2 between regions 12' and 14' without control gate 10'. Thus, it can be seen that the spacing L1 may be used to control the snap back voltage, i.e., the longer the spacing L1 the higher the snap back voltage, and the spacing L2 may be used to control the sustaining voltage, i.e., the shorter the spacing L2 the lower the sustaining voltage and, therefore, the higher the voltage to which the capacitor C can be charged during the sustaining mode.

It can be seen that a novel driver circuit has been disclosed which is very simple in construction, has high performance and requires a very small amount of surface on a semiconductor substrate. This driver circuit is particularly suitable for rapidly charging large capacitors whether located on or off a semiconductor chip.

While the invention has been particularly shown and described with reference to preferred embodiments thereof, it will be understood by those skilled in the art that various changes in form and details may be made therein without departing from the spirit and scope of the invention.

What is claimed is:

1. A driver circuit comprising
   a field effect transistor,
   a capacitor serially connected with said transistor, and
   means for operating said transistor in a sustaining mode, said operating means including means for applying a control voltage to a control gate of said transistor and means for applying a voltage differential in excess of a sustaining voltage of said transistor across said transistor and said capacitor, said voltage differential being equal to or greater than the snap back voltage of said transistor at said control voltage.

2. A driver circuit as set forth in claim 1 wherein said transistor has first and second spaced apart diffusion regions of a given conductivity type and a third diffusion region of an opposite conductivity type interposed between said first and second regions forming a first PN junction between said first and third regions, said voltage differential having a component across said PN junction which is less than the intrinsic breakdown voltage of said PN junction.

3. A driver circuit as set forth in claim 2 wherein said first region is a drain diffusion region and said second region is a source diffusion region.

4. A driver circuit as set forth in claim 3 wherein said given conductivity type is N type conductivity and said opposite conductivity type is P type conductivity and said first region is at a more positive potential than the potential at said second region.

5. A driver circuit as set forth in claim 4 wherein said transistor has a given threshold voltage and said operating means applies to said control gate said given control voltage which has a magnitude when reduced by said given threshold voltage greater than said voltage differential minus said sustaining voltage.

6. A driver circuit as set forth in claim 4 wherein said operating means applies to said control gate said given control voltage which has a magnitude when reduced by said given threshold voltage less than said voltage differential minus said sustaining voltage.

7. A driver circuit as set forth in claim 3 wherein said source diffusion region is substantially wider than the width of said control gate.

8. A driver circuit as set forth in claim 7 wherein said source and drain diffusion regions within said control gate are spaced apart by a distance substantially greater than the distance between said source and drain diffusion regions without said control gate 9. A driver circuit as set forth in claim 1 further including means for selectively discharging said capacitor.

10. A driver circuit comprising
    a semiconductor substrate,
    a field effect transistor having a control gate coupled to said substrate, a drain diffusion region and a source diffusion region formed in said substrate, said transistor having a given sustaining voltage and a given snap back voltage at a given control voltage on said gate,
    a capacitor serially connected with said transistor at said source region,
    means for applying to said drain region a first voltage having a magnitude at least equal to said given snap back voltage, and
    means for applying said given control voltage to said control gate.

11. A driver circuit as set forth in claim 10 further including means for selectively discharging said capacitor.

12. A driver circuit as set forth in claim 10 wherein said first voltage develops a voltage across the PN junction at said drain region which is less than the intrinsic breakdown voltage of the PN junction.

13. A driver circuit as set forth in claim 10 wherein the width of said control gate is substantially less than the width of said source region.

14. A driver circuit as set forth in claim 13 wherein the distance between said drain and source regions within said control gate is substantially longer than the distance between said drain and source regions without said control gate.

* * * * *